(12) United States Patent
Araragi (10) Patent No.: US 10,742,207 B2
(45) Date of Patent: Aug. 11, 2020

(54) DRIVE CIRCUIT OF SWITCHING CIRCUIT

(71) Applicant: DENSO CORPORATION, Kariya, Aichi-pref. (JP)

(72) Inventor: Akifumi Araragi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/450,234

(22) Filed: Jun. 24, 2019

(65) Prior Publication Data

US 2020/0007122 A1    Jan. 2, 2020

(30) Foreign Application Priority Data

Jun. 27, 2018    (JP) .................................. 2018-121900

(51) Int. Cl.
| | |
|---|---|
| *H03K 17/567* | (2006.01) |
| *H02M 1/08* | (2006.01) |
| *H02M 7/5387* | (2007.01) |
| *H02P 27/06* | (2006.01) |

(52) U.S. Cl.
CPC ............ *H03K 17/567* (2013.01); *H02M 1/08* (2013.01); *H02M 7/5387* (2013.01); *H02P 27/06* (2013.01)

(58) Field of Classification Search
None
See application file for complete search history.

(56) References Cited

U.S. PATENT DOCUMENTS

| | | | |
|---|---|---|---|
| 8,531,212 B2* | 9/2013 | Dewa .................... | H03K 17/063 327/108 |
| 9,692,405 B2* | 6/2017 | Na .......................... | H03K 17/06 |
| 10,081,253 B2* | 9/2018 | Fukuta ................... | H02P 29/027 |
| 10,511,302 B2* | 12/2019 | Araragi ................ | H03K 17/063 |
| 2016/0226386 A1 | 8/2016 | Fukuta | |

* cited by examiner

*Primary Examiner* — Jeffery S Zweizig
(74) *Attorney, Agent, or Firm* — Oliff PLC (57) ABSTRACT

Provided is a switch drive circuit that drives a plurality of switches mutually connected in parallel including a charge unit allowing charge current to flow to the gate of the switch; an off switch connecting between the gate of the switch and the ground; a detection unit detecting whether charge state of the gate of the switch is in a predetermined state; and a changeover unit that changes a state of off switches when the charge units allow the charge current to flow to the gate. The changeover unit changes the state of the off switches to be ON when detection units do not detect the charge state of the gate being in the predetermined state, and to change the state of the off switches to be OFF when detection units detect the charge state of the gate being in the predetermined state.

5 Claims, 7 Drawing Sheets

DRIVE CIRCUIT OF SWITCHING CIRCUIT

CROSS-REFERENCE TO RELATED APPLICATION

This application is based on and claims the benefit of priority from earlier Japanese Patent Application No. 2018-121900 filed Jun. 27, 2018, the description of which is incorporated herein by reference.

BACKGROUND

Technical Field

The present disclosure relates to drive circuits of switches.

Description of the Related Art

Conventionally, a drive circuit for driving switches is known. For example, it is disclosed a drive circuit for driving a plurality of switches which are parallelly connected to each other. Specifically, the drive circuit includes driving parts provided for respective switches assigned as driving objects. Each driving part drives a switch assigned for the own driving object. The drive signal provides either an ON command or an OFF command for the switching.

SUMMARY

The present disclosure provides a switch drive circuit that drives a plurality of switches mutually connected in parallel.

The switch drive circuit includes: charge units each provided for respective switches of the plurality of switches, allowing a charge current to flow to a gate of each switch; off switches each provided for respective switches of the plurality of switches, connecting between the gate of each switch and a ground to which charge of the gate is discharged; detection units each provided for respective switches of the plurality of switches, detecting whether a charge state of the gate of each switch is in a predetermined state; and a changeover unit that changes a state of respective off switches when respective charge units allow the charge current to flow to the gate of each switch.

DETAILED DESCRIPTION OF THE PREFERRED EMBODIMENTS

First Embodiment

Hereinafter, with reference to the drawings, a first embodiment in which a drive circuit of the present disclosure is embodied will be described. The drive circuit according to the present embodiment configures a control system of a rotary electric machine.

Figure 1:
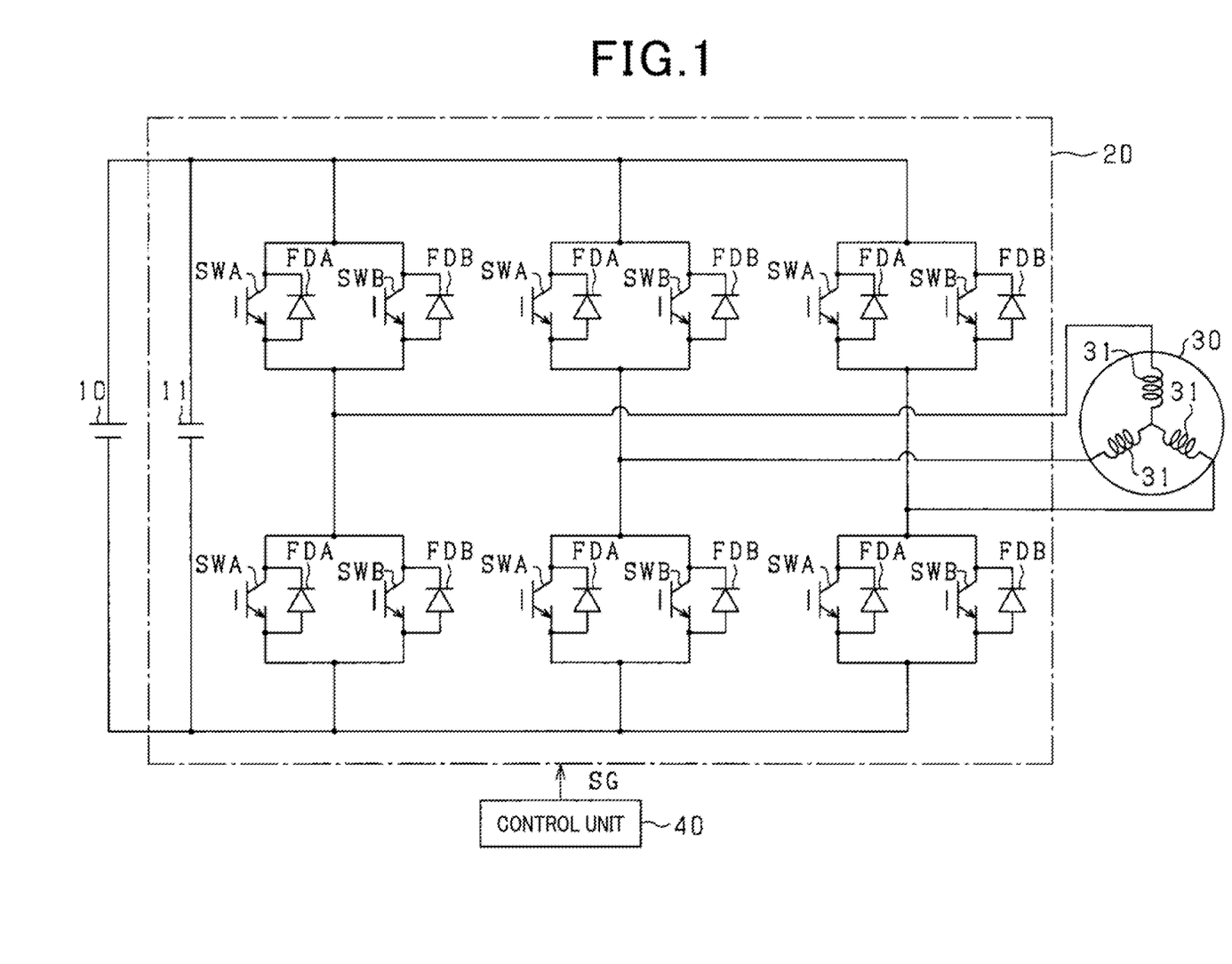
FIG. 1 is an overall configuration of a control system of a rotary electric machine according to a first embodiment of the present disclosure.

As shown in FIG. 1, the control system is provided with a battery 10 as a DC (direct current) power source, an inverter 20 as a power converter, a rotary electric machine 30 and a control unit 40. The rotary electric machine 30 is connected to the battery 10 via the inverter 20. Note that a smoothing capacitor 11 is provided between the battery 10 and the inverter 20. For the rotary electric machine 30, a permanent magnet field type synchronous machine may be employed.

The Inverter 20 is provided with upper and lower arm switches for there-phase units. Each of the upper and lower arm switches is configured of a first switch SWA and a second switch SWB which are parallelly connected. The first end of the smoothing capacitor 11 is connected to high side terminals of the upper arm first and second switches SWA and SWB of each phase unit. The high side terminals of the lower arm first and second switches SWA and SWB of each phase unit are connected to the low side terminals of the upper arm first and second switches SWA and SWB of each phase unit. The second end of the smoothing capacitor 11 is connected to low side terminals of the lower arm first and second switches SWA and SWB of each phase unit. In each phase unit, the first end of the winding 31 of the rotary electric machine 30 is connected to a connection point between the low side terminals of the upper arm first and second switches SWA and SWB and the high side terminals of the lower arm first and second switches SWA and SWB. The second end of the winding 31 of each phase unit is connected to the neutral point.

According to the present embodiment, a voltage controlled type semiconductor switching element is used for the first and second switches SWA and SWB. Specifically, an SI-IGBT (an insulated gate bipolar transistor) is employed. Hence, in each of the first and second switches, the high side terminal is collector and the low side terminal is emitter. For the first and second switches SWA and SWB, the first and second free-wheel diodes FDA and FDB are parallelly connected in reverse. Also, according to the present embodiment, as the first and second switches SWA and SWB, switches having the same specification are used. Specifically, switches having the same threshold voltage Vth are used.

The control unit 40 controls, in each phase unit, the upper arm first and second switches SWA and SWB, and the lower arm first and second switches SWA and SWB to be alternately ON state. The control quantity is a torque for example. The control unit 40 outputs an ON command that commands the ON state, and an OFF command that commands the OFF state, as the drive signal SG of the first and second switches SWA AND SWB, to a drive circuit Dr individually provided for the pair of first and second switches SWA and SWB in each arm and each phase unit.

The drive circuit Dr included in the inverter 20 acquires the drive signal SG from the control unit 40, and controls, based on the acquired drive signal SG, the first switch SWA and the second switch SWB to be ON or OFF state in synchronous manner.

Figure 2:
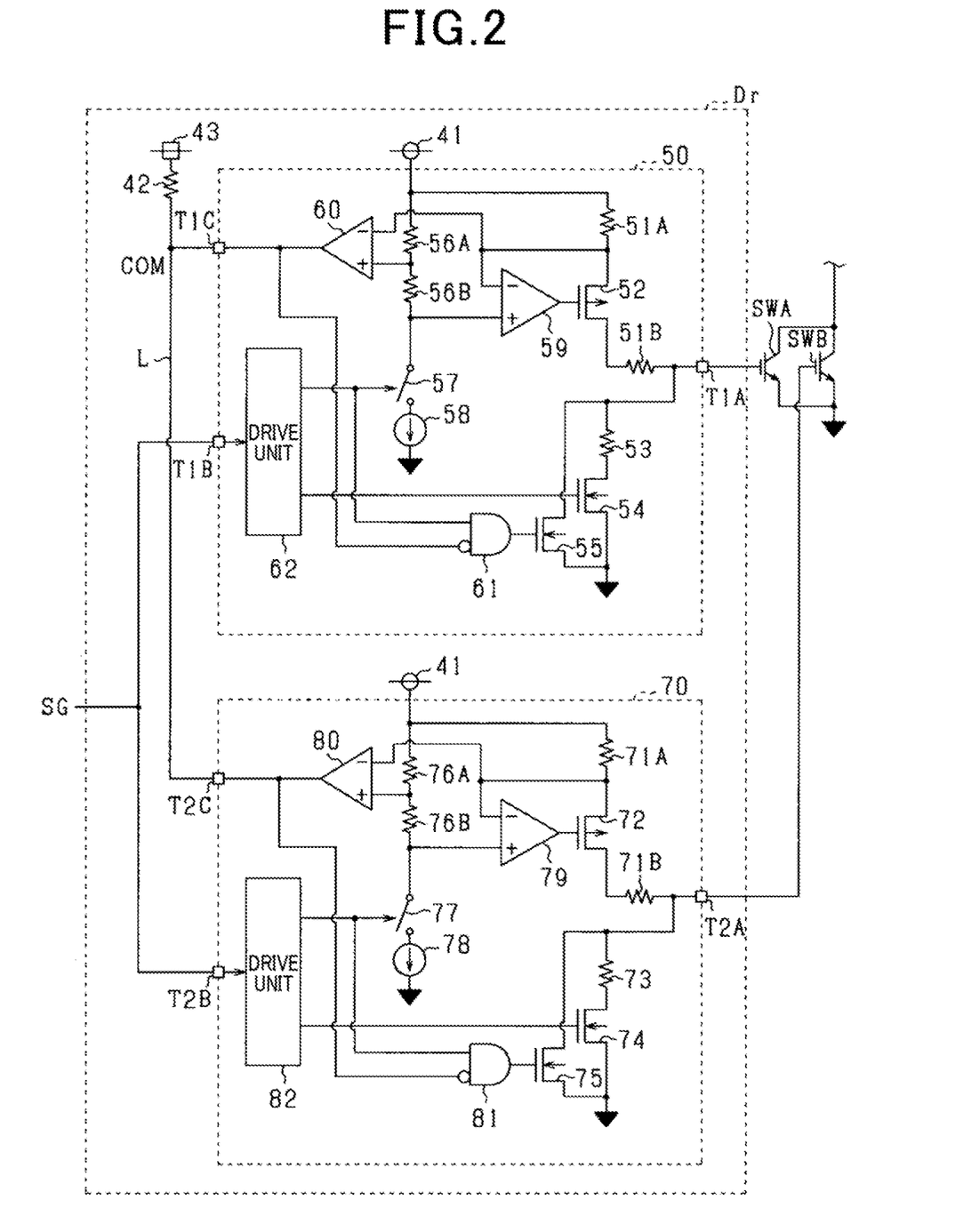
FIG. 2 is a diagram showing a configuration of a drive circuit.

Next, with reference to FIG. 2, the drive circuit Dr of the first and second switches will be described.

The drive circuit Dr includes a constant voltage source 41, a first substrate 50 and a second substrate 70. The first substrate 50 and the second substrate 70 are arranged to be apart from each other.

First, a configuration of the first substrate 50 will be described. The drive circuit Dr Is provided with a first A charge resistor 51A, a first charge switch 52 and a first B charge resistor 51B. According to the present embodiment, the first charge switch 52 is configured as P-channel MOSFET. The first A charge resistor 51A, the first charge switch 52 and the first B charge resistor 51B are mounted on the first substrate 50.

The constant voltage source 41 is connected to the first end of the first A charge resistor 51A, and the source of the first charge switch 52 is connected to the second end of the first A charge resistor 51A. The first end of the first B charge resistor 51B is connected to the drain of the first charge switch 52. The first A terminal T1A of the first substrate 50 is connected to the second end of the first B charge resistor 51B. The gate of the first switch SWA is connected to the first A terminal T1A.

The drive circuit Dr is provided with a first discharge resistor 53, a first discharge switch 54 and a first off switch 55. The first discharge switch 54 and the first off switch 55 are configured as N-channel MOSFET. The first discharge resistor 53, the first discharge switch 54 and the first off switch 55 are mounted on the first substrate 50.

The first end of the first discharge resistor 53 and the drain of the first off switch 55 are connected to the first A terminal T1A. The drain of the first discharge switch 54 is connected to the first discharge switch 54. The emitter of the first switch SWA as the ground is connected to each source of the first discharge switch 54 and the first off switch 55.

The drive circuit Dr includes a first A adjustment resistor 56A, a first B adjustment resistor 56B, a first changeover switch 57, a first constant current source 58, a first operational amplifier (op-amp) 59, a first comparator 60, a first AND circuit 61 and a first drive unit 62. According to the present embodiment, the first A adjustment resistor 56A, the first B adjustment resistor 56B, the first changeover switch 57, the first constant current source 58, the first op-amp 59, the first comparator 60, the first AND circuit 61 and the first drive unit 62 are mounted on the first substrate 50.

The constant voltage source 41 is connected to the first end of the first A adjustment resistor 56A, and the first end of the first B adjustment resistor 56B is connected to the second end of the first A adjustment resistor 56A. The emitter of the first switch SWA is connected to the second end of the first B adjustment resistor 56B via the first changeover switch 57 and the first constant current source 58.

The second end of the first A resistor 51A is connected to the inverting input of the first op-amp 59, and the second end of the first B adjustment resistor 56B is connected to the non-inverting input of the first op-amp 59. The gate of the first charge switch 52 is connected to the output terminal of the first op-amp 59. According to the present embodiment, the first A charge resistor 51A, the first charge switch 52, the first A adjustment resistor 56A, the first B adjustment resistor 56B, the first changeover switch 57 and the first current source 58 correspond to the constant current charge unit corresponding to the first switch SWA.

The first drive unit 62 acquires the drive signal SG from the control unit 40 via the first B terminal T1B of the first substrate 50. The first drive unit 62 controls, based on the acquired drive signal SG, the first charge switch 52, the first discharge switch 54, the first off switch 55, the first changeover switch 57 to be ON and OFF. The function of the first drive unit 62 can be achieved by software stored in a substantial tangible recording media, a computer or hardware which executes the software, or a combination thereof.

The second end of the first A charge resistor 51A is connected to the inverting input of the first comparator 60, and the connection point between the first A adjustment resistor 56A and the first B adjustment resistor 56B is connected to the non-inverting input of the first comparator 60. The first C terminal T1C of the first substrate 50 is connected to the output terminal of the first comparator 60. According to the present embodiment, the first comparator 60 corresponds to a detection unit for the first switch SWA.

The first AND circuit 61 accepts a command signal for the first changeover switch 57, outputted by the first drive circuit 62, and a logical inverting signal of the output signal of the first comparator 60. The gate of the first off switch 55 is connected to the output terminal of the first AND circuit 61.

Subsequently, a configuration of the second substrate 70 will be described. The configuration of the second substrate 70 is the same as that of the first substrate 50. Hence, explanation of the detailed configuration of the second substrate 70 will be appropriately omitted.

The drive circuit Dr is provided with a second A charge resistor 71A, a second charge switch 72 and a second charge resistor 718. According to the present embodiment, the second charge switch 72 is configure as P-channel MOSFET. The second A charge resistor 71A, the second charge switch 72 and the second B charge resistor 71B are mounted on the second substrate 70.

The first end of the second B charge resistor 71B is connected to the drain of the second switch 72. The second A terminal T2A of the second substrate 70 is connected to the second end of the second B charge resistor 71B. The gate of the second switch SWB is connected to the second A terminal T2A.

The drive circuit Dr is provided with a second discharge resistor 73, a second discharge switch 74, a second off switch 75, a second A adjustment resistor 76A, a second B adjustment resistor 76B, a second changeover switch 77, a second constant current power source 78, a second op-amp 79, a second comparator 80, a second AND circuit 81 and the second drive circuit 92, which are mounted on the second substrate 70. According to the present embodiment, the second discharge switch 74 and the second off switch 75 are configured as N-channel MOSFETs. The emitter of the second switch SWB as the ground is connected to each source of the second discharge switch 74 and the second off switch 75.

The second drive unit 82 acquires a drive signal SG which is common signal of the drive signal SG inputted to the first B terminal T1B, via the second B terminal T2B of the second substrate 70. The second drive unit 82 controls, based on the acquired drive signal SG, the second charge switch 72, the second discharge switch 74, the second of switch 75 and the second changeover switch 77 to be ON and OFF.

The second C terminal T2C of the second substrate 70 is connected to the output terminal of the second comparator 80. The second AND circuit 81 accepts a command signal for the second changeover switch 77, outputted by the second drive circuit 82, and a logical inverting signal of the output signal of the second comparator 80. The gate of the second off switch 75 is connected to the output terminal of the second AND circuit 81.

The drive circuit Dr is provided with a second constant voltage source 43, a resistor 42 and a communication line L. The second constant voltage source 43 is connected to the first end of the resistor 42, and the first C terminal T1C and the second C terminal T2C are connected to the second end of the resistor 42 via the communication line L. Hereinafter, the voltage signal in the second end side of the resistor 42 is referred to as a communication signal COM.

According to the present embodiment, the second charge resistor 71A, the second charge switch 72, the second A adjustment resistor 76A, the second changeover switch 77 and the second constant current source 78 correspond to the constant current charge unit for the second switch SWB. The first AND circuit 61 corresponds to a changeover unit for the first switch SWA, and the second AND circuit 81 corresponds to a changeover unit for the second switch SWB.

According to the present embodiment, the resistance values of the first A adjustment resistor 56A and the second A adjustment resistor 76A are set to be the same value, and the resistance values of the first B adjustment resistor 56B and the second B adjustment resistor 76B are set to be the same value. Further, the resistance values of the first B charge resistor 51B and the second B charge resistor 71B are set to be the same value.

Figure 3:
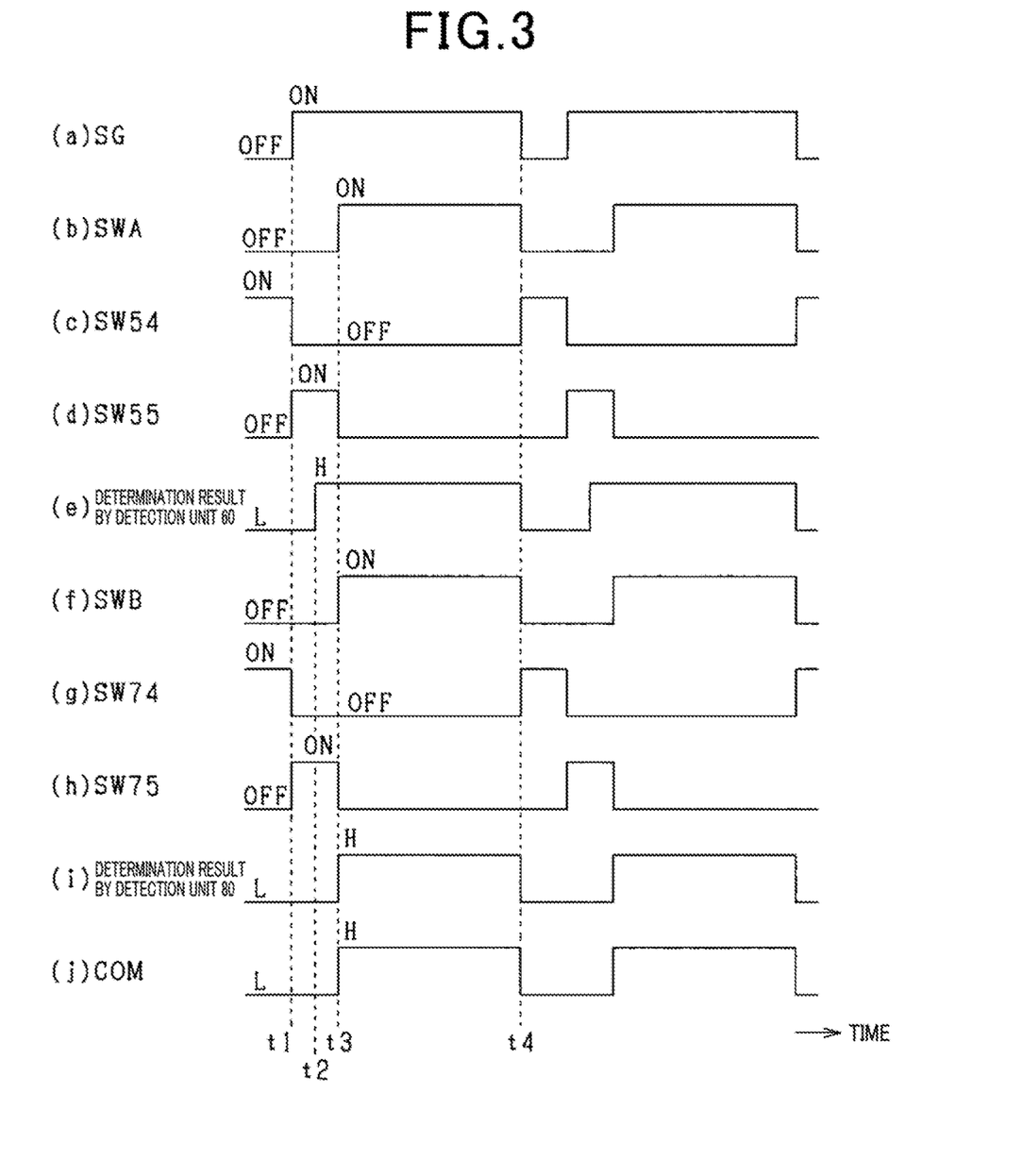
FIG. 3 is a timing diagram showing operation of the drive circuit, where signals are labeled with (a) to (k)

Subsequently, with reference to FIG. 3, an operation mode of the drive circuit Dr will be described. FIG. 3 (a) shows a change in the drive signal SG, FIG. 3 (b), (f) show a change in the drive states of the first and second switches SWA and SWB, FIG. 3 (c), (g) shows a change in the drive states of the first and second discharge switches 54 and 74, and FIG. 3 (d), (h) show a change in the drive states of the first and second off switches 55 and 75. FIG. 3 (e), (i) show a change in the determination results of the first and second comparator 60 and 80, and FIG. 3 (j) shows a change in the communication signal COM.

At time t1, the first drive unit 62 determines that the acquired drive signal SG is an ON command, and outputs an ON command with logical H to the first changeover switch 57 to change the state of the first changeover switch 57 to be ON, and changes the state of the first discharge switch 54 to be OFF. Thus, the gate voltage of the first charge switch 52 is adjusted such that the voltage difference between the second end side of the first A charge resistor 51A and the emitter of the first switch SWA is the same as the voltage difference between the second end side of the first B adjustment resistor 56B and the emitter of the first switch SWA. As a result, a constant current starts to flow to the gate of the first switch SWA.

Also, at time t1, the second drive unit 82 determines that the acquired drive signal SG is ON command, outputs the ON command with logical H to the second changeover switch 77 to change the state of the second changeover switch 77 to be ON, and changes the state of the second discharge switch 74 to be OFF. Thus, the gate voltage of the second charge switch 72 is adjusted such that the voltage difference between the second end side of the second A charge resistor 71A and the emitter of the second switch SWB is the same as the voltage difference between the second end side of the second B adjustment resistor 76B and the emitter of the second switch SWB. As a result, a constant current starts to flow towards the gate of the second switch SWB.

Here, since the response time of the first op-amp 59 and response time of the second op-amp 79 are different, the timing at which the constant current starts to flow through the first A charge resistor 51A is earlier than the timing at which the constant current starts to flow through the second A charge resistor 71A. As a result, as shown in FIG. 3(e), at the time t2, it is determined that the voltage of the signal at the non-inverting input terminal of the first comparator 60 is larger than that of the Inverting input terminal thereof. This determination timing is set to a timing at which the constant current flowing through the first A charge resistor 51A reaches a predetermined current where a predetermined ratio (e.g. 50% or more, specifically 80%) is multiplied to the target current Itgt. This timing is set by adjusting each resistor value of the first A adjustment resistor 56A and the first B adjustment resistor 56B.

However, at the timing t2, the voltage at the non-inverting input terminal of the second comparator 80 is determined to be no larger than the voltage at the inverting input terminal thereof. Hence, the logic of the outpour signal from the second comparator 80 becomes L, and the logic of the communication signal COM is maintained at L. In other words, the output mode of the communication signal COM is not changed. As a result, the first off switch 55 and the second off switch 75 are maintained at the on state.

Thereafter, at time t3, the voltage at the non-inverting input terminal of the second comparator 80 is determined to be larger than the voltage at the inverting input terminal thereof. This determination timing is defined as a timing at which the constant current flowing through the second A charge resistor 71A becomes the above-described predetermined current. Thus, the logic of the communication signal COM is changed to H. In other words, the output mode of the communication signal COM is changed. As a result, logic of both output signals of the first AND circuit 61 and the second AND circuit 81 are changed to logic L and the first off switch 55 and the second off switch 75 are changed to the off state.

In the case where the first and second off switches 55 and 75 are changed to the off state, the gate voltages of the first and second switches SWA and SWB start to increase. Thus, the gate voltage of the first and second switches SWA and SWB exceeds the threshold voltage Vth, and the first and second switches SWA and SWB are synchronized to be ON state.

At time t4, the first and second drive units 62 and 82 determines that the acquired drive signal SG is off command. In this case, the first and second charge switches 52 and 72, and the first and second changeover switches 57 and 77 are changed to off state, and the first and second discharge switches 54 and 74 are changed to on state. Thus, discharge current is discharged from the gate of the first and second switches SWA and SWB, and the gate voltage of the first and second switches SWA and SWB becomes less than the threshold voltage Vth. As a result, first and second switches are changed to the off state. Also, since logic L signal is applied to the gate of the first and second changeover switches 57 and 77, the first and second off switches 55 and 75 are changed to the off state.

According to the above-described present embodiment, a change timing of the first and second switches SWA and SWB to be on state can be the same timing, whereby current imbalance can be prevented from occurring. As a result, the reliability of the first and second switches SWA and SWB can be prevented from degrading.

According to the present embodiment, the communication line L, the resistor 42 and the second constant voltage source 43 as the communication unit are commonly provided for the first comparator 60 and the second comparator 80.

Hence, each of the first substrate 50 side including the first comparator 60 and the second substrate 70 side including the second comparator 80 is able to supervise the state of the charge current supplied to the gate. In particular, according to the present embodiment, the respective AND circuits 61 and 81 input the output signals from the comparators 60 and 80 via the common communication line L. Thus, in addition to the configuration in which the state of charge current is supervised by both comparators, a configuration can readily be achieved in which the off switch is changed to the on state based on the supervision result.

Second Embodiment

Figure 4:
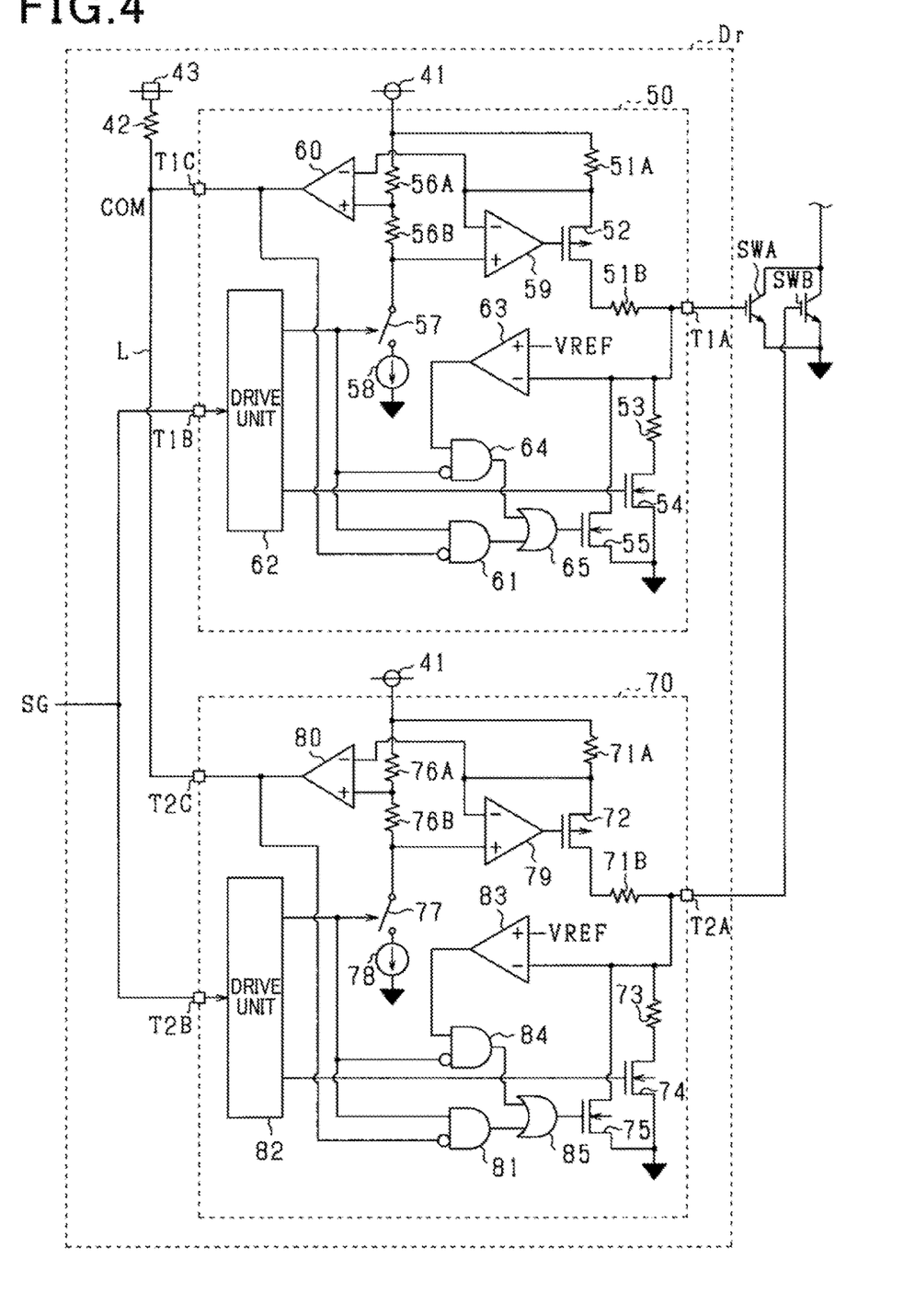
FIG. 4 is a diagram showing a configuration of a drive circuit according to a second embodiment.

Hereinafter, a second embodiment will be described with reference to the drawings. In the second embodiment, configurations different from the first embodiment will mainly be described. According to the present embodiment, the first and second off switches 55 and 75 owns off clamping function.

FIG. 4 illustrates a configuration of a drive circuit Dr according to the present embodiment. In FIG. 4, for the sake of convenience, the same reference numbers are applied to the same configurations as those shown in FIG. 2.

The first substrate 50 further includes a first determination comparator 63, a first determination AND circuit 64 and a first OR circuit 65.

The first A terminal T1A is connected to the inverting input terminal of the first determination comparator 63. The reference voltage VREF is connected to the non-inverting input terminal of the first determination comparator 63. The reference voltage VREF is set to be higher than 0 and less than the above-described threshold voltage Vth.

The first determination AND circuit 64 inputs the logical inverting signal of the command signal to the first changeover switch 57 outputted by the first drive unit 62 and the output signal of the first determination comparator 63. The first OR circuit 65 inputs each of the output signals from the first AND circuit 61 and the first determination AND circuit 64. The gate of the first off switch 55 inputs the output signal of the first OR circuit.

For the second substrate 70, the second determination comparator 83, the second determination AND circuit 84 and the second OR circuit 85 are mounted.

The second A terminal T2A is connected to the inverting input terminal of the second determination comparator 83. The non-inverting input terminal of the second determination comparator 83 inputs the above-described reference voltage VREF.

The second determination AND circuit 84 inputs the logical inverting signal of the command signal to the second changeover switch 77 outputted from the second drive circuit 82, and the output signal of the second determination comparator 83. The second OR circuit 85 inputs the output signals of the second AND circuit 81 and the second determination AND circuit 84. The output signal of the second OR circuit 85 is Inputted to the gate of the second off switch 75.

According to the present embodiment, the first AND circuit 61 and the first OR circuit 65 correspond to the changeover unit for the first switch SWA, and the second AND circuit 81 and the second OR circuit 85 correspond to the changeover unit for the second switch SWB. The first determination comparator 63, the first determination AND circuit 64 and the first OR circuit 65 corresponds to the off clamping control unit for the first switch SWA, and the second determination comparator 83, the second determina-tion AND circuit 84 and the second OR circuit 85 correspond to the off clamping control unit for the second switch SWB.

Figure 5:
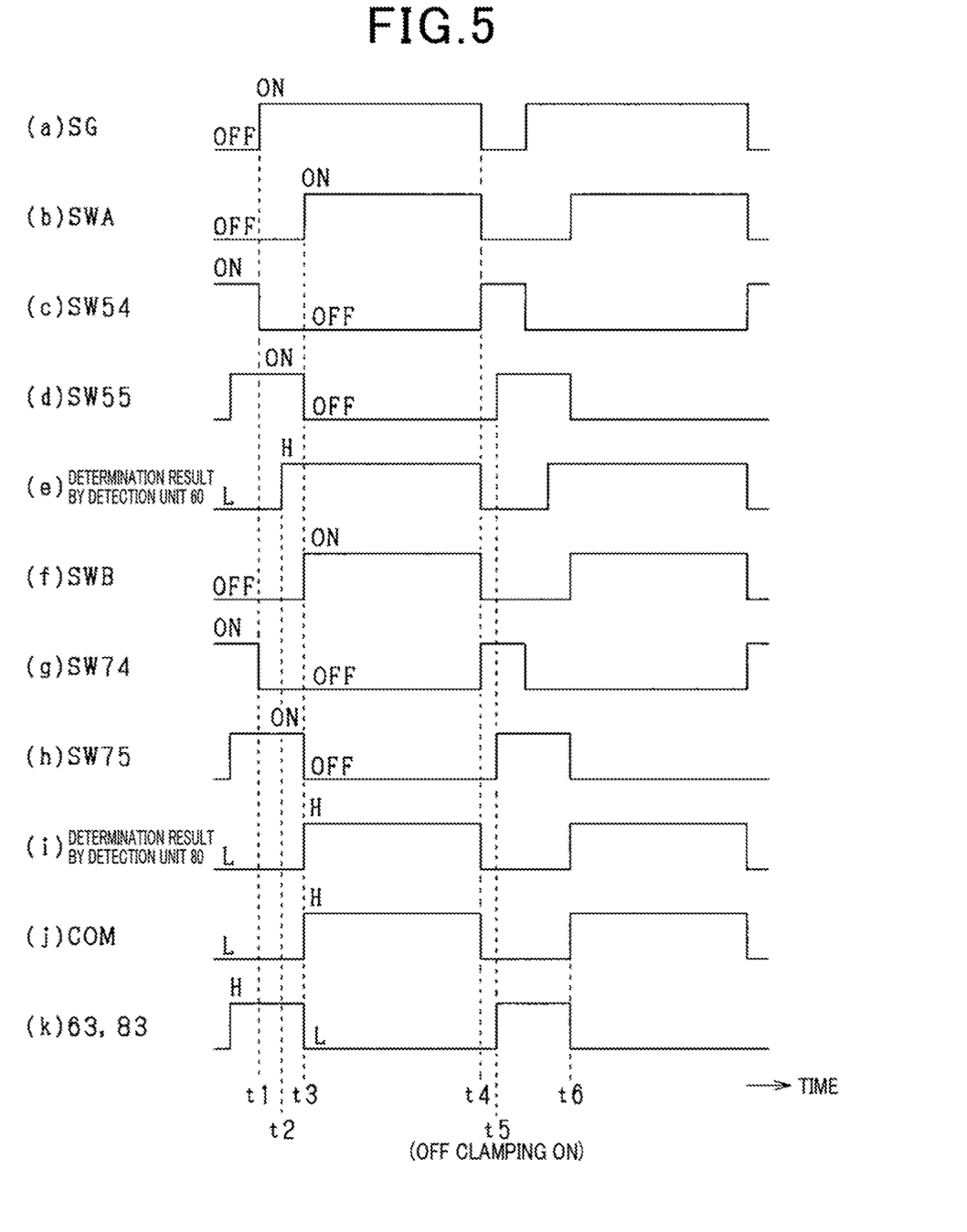
FIG. 5 is a timing diagram showing operation of the drive circuit according to the second embodiment, where signals are labeled with (a) to (k)

Subsequently, with reference to FIG. 5, it will be described that the first and second off switches 55 and 75 serve as the off clamping switch. FIGS. 5(a) to 5(j) correspond to the above-described FIGS. 3 (a) to 3 (j). FIG. 5 (k) indicates a change in the output signal of the first and second determination comparators 63 and 83. Moreover, time t1 to t4 shown in FIG. 5 correspond to the above-described t1 to t4 shown in FIG. 3.

After time t4, the gate voltage at the first and second switches SWA and SWB decreases. Then at time t5, the gate voltage decreases to be lower than the reference voltage VREF, whereby the logic state of the output signals of the first and second determination comparators 63 and 83 turn to H from L. Thus, the logic state of the output signals of the first and second determination AND circuit 64 and 84 turn to H, and the logic state of the output signals of the first and second OR circuit 65 and 85 turn to H. As a result, the first and second off switches 55 and 75 are changed to ON state during a period where the drive signal SG indicates OFF command, thereby serving as the off clamping switch. Accordingly, a self-turn on phenomenon where the first and second switches SWA and SWB erroneously turn ON which should be kept off state, can be avoided.

Thereafter, at a time t6 where the logical state of the communication signal COM turns to H, the first and second off switches 55 and 745 are changed to OFF state. Thus, the first and second switches SWA and SWB are changed to ON state.

According to the present embodiment as described above, by adding such a simple configuration, i.e. the first and second determination comparators 63 and 83, the second determination AND circuits 64 and 84, and the first and second OR circuits 65 and 85, the first and second off switches 55 and 75 can be served as an off clamping switch.

Third Embodiment

Figure 6:
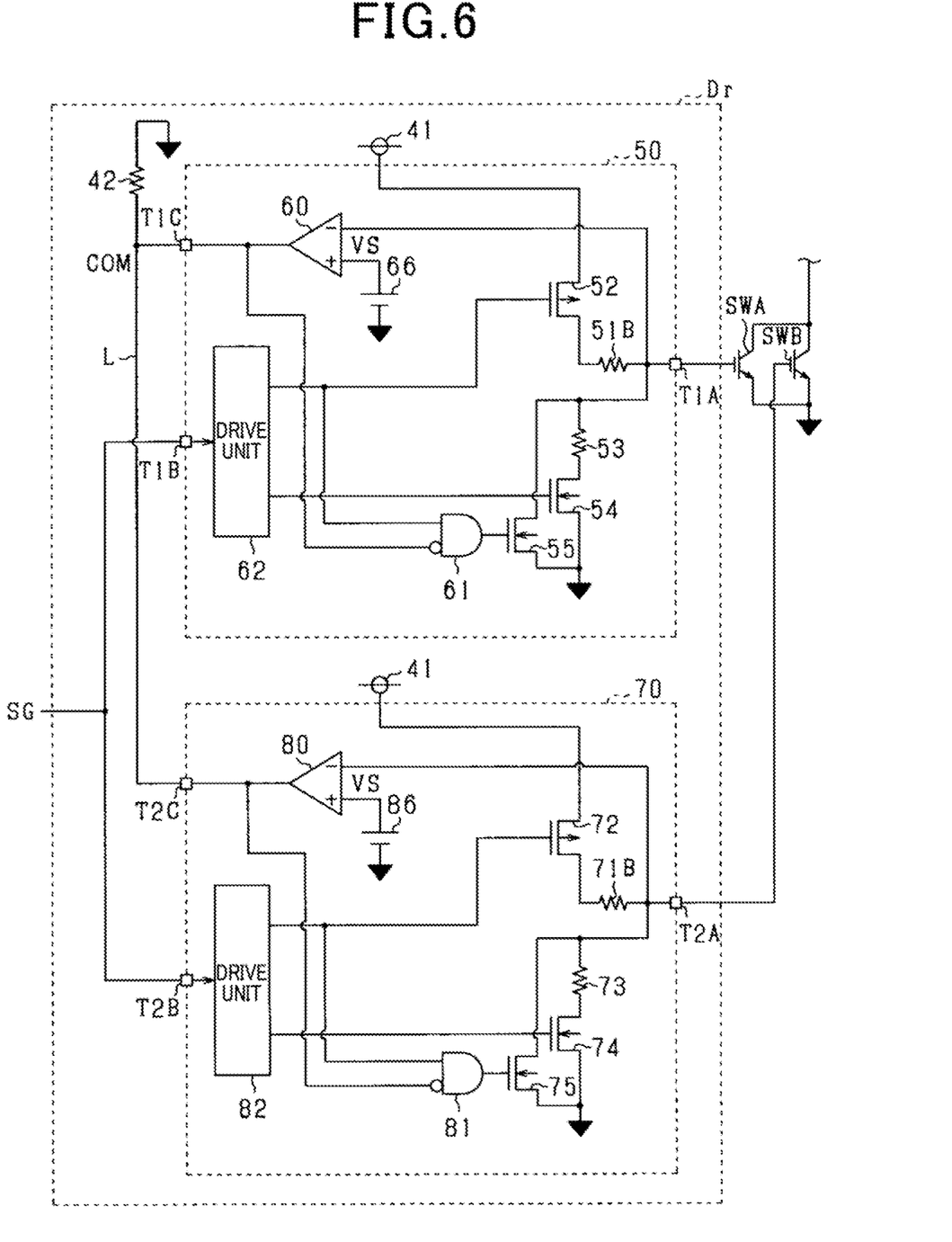
FIG. 6 is a diagram showing a drive circuit according to a third embodiment.

Hereinafter, a third embodiment will be described with reference to the drawings. In the third embodiment, configurations different from the first embodiment will mainly be described. According to the present embodiment, instead of using the constant current control, a constant voltage control is utilized for changing the state of the first and second switches SWA and SWB.

FIG. 6 illustrates a drive circuit Dr according to the present embodiment. In FIG. 6, for the sake of convenience, the same reference numbers are applied to the same configurations as those shown in FIG. 2.

First, a configuration of the first substrate 50 will be described. The constant voltage source 41 is connected to the source of the first charge switch 52. The first A terminal T1A is connected to the inverting input terminal of the first comparator 60. The positive terminal of the first power source 66 mounted on the first substrate 50 is connected to the non-inverting input terminal of the first comparator 60. The emitter of the first switch SWA is connected to the negative terminal of the first power source 66.

Subsequently, a configuration of the second substrate 70 will be described. The constant voltage source 41 is connected to the source of the second charge switch 72. The second A terminal T2A is connected to the inverting input terminal of the second comparator 80. The positive terminal of the second power source 86 mounted on the second substrate 70 is connected to the non-inverting Input terminal of the second comparator 80. The emitter of the second switch SWB is connected to the negative terminal of the second power source 86.

According to the present embodiment, the first charge switch 52 and the first B charge resistor 51B correspond to the constant voltage charge unit for the first switch SWA, the second charge switch 72 and the second B charge resistor 71B correspond to the constant voltage charge unit for the second switch SWB.

According to the present embodiment, the output voltage of the first power source 66 and the second power source 86 are referred to as a predetermined voltage VS. The predetermines voltage VS is set to be larger than 0 and less than the above-described threshold voltage.

According to the present embodiment as described above, when both gate voltages of the first and second switches SWA and SWB exceed the predetermined voltage VS under a state where the drive signal SG indicates an ON command, the first and second off switches 55 and 75 are changed to the off state. Thus, the first and second switches SWA and SWB are synchronized to be ON state, and the current imbalance can be prevented from occurring.

Other Embodiments

The above-described embodiments may be modified in the following manner.

The voltage applied to the inverting input terminals of the first and second comparators 60 and 80 may be divided voltage of the gate voltage of the first and second switches SWA and SWB. In this case, since the predetermined voltage VS corresponds to the divided value, the predetermined voltage VS may be set to be smaller than the value set in the third embodiment.

The configuration in which the first and second off switches 55 and 75 serve as the off clamping switch may be adapted for the configuration of the third embodiment.

Figure 7:
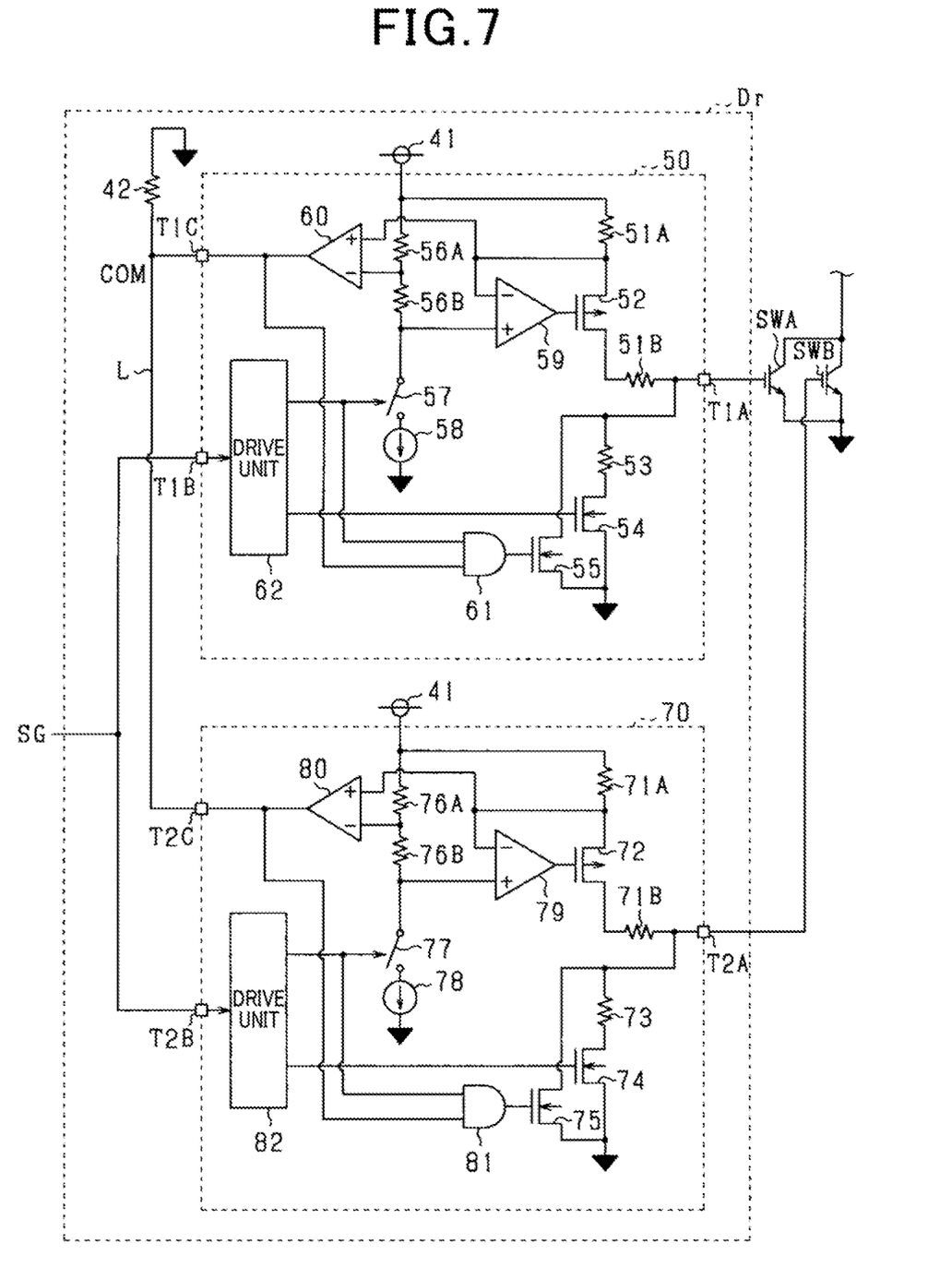
FIG. 7 is a diagram showing a configuration of a drive circuit according to another embodiment.

As the configuration of the communication unit, for example, a configuration shown in FIG. 7 can be utilized. In FIG. 7, for the sake of convenience, the same reference numbers are applied to the same configurations as those shown in FIG. 2.

The emitter of the first and second switches SWA and SWB are connected to the first end of the resistor 42. Also, for each of the first and second comparators 60 and 80, the input signal at the non-inverting input terminal and the input signal at the inverting input terminal are exchanged compared to the signals shown in FIG. 2. The first and second AND circuits 61 and 81 inputs the output signals of the first and second comparators 60 and 80 instead of logical inverting signal of the output signals of the first and second comparators 60 and 80. In this case, when each charge current flowing through respective first A and second A charge resistors 51A and 71A exceeds the predetermined current, the logic state of the output signal of the first and second comparators 60 and 80 turn to L from H, and the first and second off switches 55 and 75 can be OFF state.

The components of the drive circuit Dr may be mounted to a single common substrate instead of being mounted on separated two substrates.

The switches that constitute the inverter are not limited to IGBTs, but SIC N-channel MOSFETs may be employed for example. In this case, the high side terminal of the switch is the drain and the low side terminal is the source.

As the ground, it is not limited to the emitter of the switches SWA and SWB. For example, a negative voltage source may be used. The negative voltage source outputs a negative voltage which is lower than the voltage of this emitter.

The number of parallel connections of the switches constituting the inverter is not limited to 2, but 3 or more connections may be used. For example, the number of parallel connections of the switches may be changed depending on an amount of output current of the inverter. In this case, when providing the drive circuits adapted for the number of parallel connections, a manufacturing cost and a development man-hour increase. In this respect, since the above-described configuration is utilized in which the change timings of respective switches to be ON state can be the same, even if the number of parallel connections of the switches is changed during the design phase, the change timings of respective switches to be ON state can be the same, while reducing the manufacturing cost and the development man-hour.

As the power converter, it is not limited to an inverter, but a DC-DC converter that outputs a converted input voltage. Specifically, the converter includes at least one of a step-down function where the input voltage is stepped-down, and a boost function where a boosted input voltage is outputted.

The drive circuit according to the present disclosure is described so far.

In the field of such drive circuits for driving a plurality of switching elements, as an example, a drive circuit for driving switches is disclosed. The drive circuit drives a plurality of switches which are parallelly connected to each other. Specifically, the drive circuit includes driving parts provided for respective switches assigned as driving objects. Each driving part drives a switch assigned for the own driving object. The drive signal provides either an ON command or an OFF command for the switching.

Here, due to a configuration of the drive circuit, a period from when the ON command is inputted to the respective drive circuits to when the switches are turned ON may significantly vary. In this case, current imbalance may occur on a switch firstly turned ON among the plurality of switches. The current imbalance is a phenomenon where a larger amount of current (biased current) temporarily flows through the switch firstly turned ON than other switches. When the current imbalance occurs, the reliability of the switch where the biased current flows may be degraded.

The present disclosure provides a switch drive circuit that drives a plurality of switches mutually connected in parallel.

The switch drive circuit according to the present disclosure includes: charge units each provided for respective switches of the plurality of switches, allowing a charge current to flow to a gate of each switch; off switches each provided for respective switches of the plurality of switches, connecting between the gate of each switch and a ground to which charge of the gate is discharged; detection units each provided for respective switches of the plurality of switches, detecting whether a charge state of the gate of each switch is in a predetermined state; and a changeover unit that changes a state of respective off switches when respective charge units allow the charge current to flow to the gate of each switch. The changeover unit is configured to change the state of the respective off switches to be ON when respective detection units do not detect that the charge state of the gate of each switch is in the predetermined state, and to change the state of the respective off switches to be OFF when respective detection units detect that the charge state of the gate of each switch is in the predetermined state.

According to the present disclosure, a charge unit is provided for each switch in order to change the state of each switch to be an ON state. Here, depending on the configuration of respective charge units, a current imbalance may occur.

In this respect, according to the present disclosure, off switches and detection units are each provided for respective switches. The changeover unit of the present discourse is configured to change the state of the respective off switches to be ON when respective detection units do not detect that the charge state of the gate of each switch is in the predetermined state. In this state, since an amount of charge at the gate terminal of the respective switch is insufficient to change the switch to be in the ON state, the respective switches are maintained to be OFF state. On the other hand, the changeover unit changes the state of the off switches to be OFF state when all of the detecting units detect that the charge state of the gate is in the predetermined state. By changing the off switch to be OFF state, the amount of charge required for changing the gate of the switch becomes sufficient to change the respective switches to be ON state. As a result, variation of the switch timing of the respective switches to be ON state can be suppressed. Therefore, the current imbalance can be suppressed and degradation of the reliability of the switches can be suppressed.

What is claimed is:

1. A switch drive circuit that drives a plurality of switches mutually connected in parallel comprising:
    charge units each provided for respective switches of the plurality of switches, allowing a charge current to flow to a gate of each switch;
    off switches each provided for respective switches of the plurality of switches, connecting between the gate of each switch and a ground to which charge of the gate is discharged;
    detection units each provided for respective switches of the plurality of switches, detecting whether a charge state of the gate of each switch is in a predetermined state; and
    a changeover unit that changes a state of respective off switches when respective charge units allow the charge current to flow to the gate of each switch,
    wherein
        the changeover unit is configured to change the state of the respective off switches to be ON when respective detection units do not detect that the charge state of the gate of each switch is in the predetermined state, and to change the state of the respective off switches to be OFF when respective detection units detect that the charge state of the gate of each switch is in the predetermined state.

2. The switch drive circuit according to claim 1, wherein
the switch drive circuit includes a communication unit commonly provided for respective detection units, transmitting a detection result of the respective detection units;
the communication unit is configured to change an output mode of a signal indicating the detection result, when the respective detection units detect that the charge state of the gate of each switch is in the predetermined state; and
the changeover unit is configured to change the state of respective off switches to be OFF when determining that the communication unit changes the output mode of the signal.

3. The switch drive circuit according to claim 2, wherein
the changeover unit is provided for each of the plurality of switches; and
each of the changeover units is configured to change a corresponding one of the off switches to be OFF.

4. The switch drive circuit according to claim 1, wherein
the switch drive circuit includes an off clamping control unit that changes the off switch to be ON when a drive signal of the switch is an OFF command.

5. The switch drive circuit according to claim 1, wherein
the charge unit is configured as a constant current charge unit that allows a constant current to flow to a gate of the switch.

* * * * *